US010774173B2

(12) United States Patent
Cho et al.

(10) Patent No.: US 10,774,173 B2
(45) Date of Patent: Sep. 15, 2020

(54) THERMOSETTING RESIN COMPOSITION, AND PREPREG AND SUBSTRATE USING SAME

(71) Applicant: KOLON INDUSTRIES, INC., Seoul (KR)

(72) Inventors: Hee Jin Cho, Yongin-si (KR); Do Kyung Sung, Yongin-si (KR); Sae Rom Nam, Yongin-si (KR)

(73) Assignee: KOLON INDUSTRIES, INC., Seoul (KR)

( * ) Notice: Subject to any disclaimer, the term of this patent is extended or adjusted under 35 U.S.C. 154(b) by 0 days.

(21) Appl. No.: 16/313,298

(22) PCT Filed: Jun. 29, 2017

(86) PCT No.: PCT/KR2017/006900
§ 371 (c)(1),
(2) Date: Dec. 26, 2018

(87) PCT Pub. No.: WO2018/004273
PCT Pub. Date: Jan. 4, 2018

(65) Prior Publication Data
US 2019/0153151 A1    May 23, 2019

(30) Foreign Application Priority Data
Jun. 27, 2016    (KR) ........................ 10-2016-0080442

(51) Int. Cl.
*B32B 27/38* (2006.01)
*B32B 27/26* (2006.01)
*C08G 59/22* (2006.01)
*C08G 59/24* (2006.01)
*C08G 59/40* (2006.01)
*C08G 59/56* (2006.01)
*C08J 5/24* (2006.01)
*C08L 63/00* (2006.01)
*C08G 59/46* (2006.01)
*C08L 63/08* (2006.01)
*C08K 5/357* (2006.01)
*C08G 59/50* (2006.01)
*C08K 5/00* (2006.01)
*C08K 5/17* (2006.01)
*C08G 59/42* (2006.01)
*C08K 5/10* (2006.01)
*C08G 59/62* (2006.01)
*C08G 59/64* (2006.01)
*C08G 73/22* (2006.01)
*H05K 1/03* (2006.01)

(52) U.S. Cl.
CPC ............ *C08G 59/24* (2013.01); *C08G 59/40* (2013.01); *C08G 59/4014* (2013.01); *C08G 59/4021* (2013.01); *C08G 59/42* (2013.01); *C08G 59/46* (2013.01); *C08G 59/504* (2013.01); *C08G 59/5033* (2013.01); *C08G 59/5046* (2013.01); *C08G 59/56* (2013.01); *C08G 59/62* (2013.01); *C08G 59/64* (2013.01); *C08G 73/22* (2013.01); *C08J 5/24* (2013.01); *C08K 5/0025* (2013.01); *C08K 5/10* (2013.01); *C08K 5/17* (2013.01); *C08K 5/357* (2013.01); *C08L 63/08* (2013.01); *C08J 2363/00* (2013.01); *H05K 1/0366* (2013.01)

(58) Field of Classification Search
CPC ......... C08L 63/00; C08G 59/22; C08G 59/24; C08G 59/245; C08G 59/40; C08G 59/4007; C08G 59/56; B32B 27/26; B32B 27/38; C08J 5/24
USPC ...................... 523/427, 428; 428/297.4, 413
See application file for complete search history.

(56) References Cited

U.S. PATENT DOCUMENTS

| 9,546,262 | B1 * | 1/2017 | Tu ........................ C08K 5/5313 |
| 2008/0302471 | A1 * | 12/2008 | Tsuei ................... C08G 59/184 |
| | | | 156/242 |
| 2011/0139496 | A1 * | 6/2011 | Nakamura ................ B32B 7/12 |
| | | | 174/256 |
| 2012/0318571 | A1 | 12/2012 | Tietze et al. |
| 2012/0329945 | A1 * | 12/2012 | Mori .................. C08G 73/0233 |
| | | | 524/611 |
| 2015/0051315 | A1 | 2/2015 | Wang et al. |
| 2016/0244471 | A1 | 8/2016 | He |
| 2016/0272808 | A1 | 9/2016 | You et al. |

(Continued)

FOREIGN PATENT DOCUMENTS

| CN | 105348743 A | * | 2/2016 | ............. C08L 63/00 |
| KR | 10-2010-0065385 A | | 6/2010 | |
| KR | 10-2013-0048209 A | | 5/2013 | |

(Continued)

OTHER PUBLICATIONS

Machine translation of CN-105348743-A (no date).*
International Search Report for PCT/KR2017/006900 dated Nov. 1, 2017 [PCT/ISA/210].

*Primary Examiner* — Michael J Feely
(74) *Attorney, Agent, or Firm* — Sughrue Mion, PLLC

(57) ABSTRACT

The present invention relates to a thermosetting resin composition, and a prepreg and a printed circuit board using the same and, more particularly, to a thermosetting resin composition, and a prepreg and a printed circuit board using the same, wherein the thermosetting resin composition can be used for a printed circuit board which simultaneously has excellent low dielectric loss characteristics, good moisture absorption and heat resistance, low thermal expansion characteristics, and thermal stability.

20 Claims, No Drawings

(56) References Cited

U.S. PATENT DOCUMENTS

2016/0297967 A1   10/2016  Jung et al.

FOREIGN PATENT DOCUMENTS

| KR | 10-1377312 B1 | 3/2014 |
| KR | 10-2014-0124855 A | 10/2014 |
| KR | 10-2015-0060452 A | 6/2015 |
| KR | 10-2015-0114872 A | 10/2015 |
| KR | 10-2016-0032075 A | 3/2016 |
| WO | 2009/137144 A2 | 11/2009 |
| WO | 2015/188377 A1 | 12/2015 |

* cited by examiner

THERMOSETTING RESIN COMPOSITION, AND PREPREG AND SUBSTRATE USING SAME

CROSS REFERENCE TO RELATED APPLICATIONS

This application is a National Stage of International Application No. PCT/KR2017/006900, filed on Jun. 29, 2017, which claims priority from Korean Patent Application No. 10-2016-0080442, filed on Jun. 27, 2016.

TECHNICAL FIELD

The present invention relates to a thermosetting resin composition capable of preparing a substrate having excellent dielectric characteristics, heat resistance and moisture resistance, and a prepreg and a printed circuit board using the same.

BACKGROUND ART

Recently, with the miniaturization of mobile communication devices, satellite broadcast receiving devices, computers, etc., miniaturization, complexing, high-functionalizing, and high-precisionizing are being advanced for the electronic parts used in these devices and it is required to cope with high densification and high-speed signal transmission in substrate wiring patterns in electronic circuit components.

Also, in recent years, the frequency band of signals used in communication electronic devices is gradually increasing from the MHz band to the GHz band in accordance with the trend of high-functioning electronic devices. Since the electric signal has a characteristic that the transmission loss increases as the frequency increases, a low dielectric constant and low loss coefficient substrate with low dielectric loss in the GHz band and excellent transmission characteristics are requiredin order to cope with such high frequency.

Polymer insulating materials are usually used as substrate materials for printed circuit boards (PCB). In this case, various polymeric insulating materials such as polyolefin resin, epoxy resin, fluorine-based thermoplastic resin, polyimide resin and bismaleimide triazine resin have been proposed. The laminate for a printed circuit board using these materials is made of the polymer material alone or is made by blending the polymer material with glass fiber, nonwoven fabric, inorganic filler, and the like.

Examples of the method for preparing a laminate by mixing the above components include a method in which the polymeric insulating material is dissolved in the organic solvent, impregnated with the glass fabric, and dried, and the prepreg thus obtained and metal foil are superimposed and heated and pressed, and a method in which a polymer insulating material in the case of a polymer insulating material which is insoluble in an organic solvent is melted and processed by a melt injection method to be formed into a plate shape and then superimposed with a metal foil such as a copper foil or an aluminum foil and heated and pressed.

However, in the case of an epoxy resin, which is one of various polymer insulating materials conventionally provided, such an epoxy resin has drawbacks in that it has poor electrical characteristics, especially dielectric loss characteristics in the high frequency range.

Therefore, Korean Patent Publication No. 2015-0060452 discloses a thermosetting resin composition having bisphenol M type epoxy resin, bisphenol M type cyanate ester resin, polyphenylene ether and cross-linkable curing agent as a composition having low dielectric loss characteristics. However, the thermosetting resin composition proposed in this patent has obtained low dielectric characteristics to a certain extent but is not satisfactory in terms of heat resistance.

In addition, Korean Patent Publication No. 2016-0032075 discloses a non-epoxy thermoplastic resin composition in which polyphenylene ether resin is crosslinked using 1,9-decadiene and/or di-4-vinyl benzyl ether.

When the thermoplastic resin composition proposed in the above patent is used as a substrate, although some low dielectric loss characteristics could be obtained, a prepreg made from these compositions was broken during processing or handling and did not exhibit sufficient heat resistance, due to the brittleness properties of the polyphenylene ether resin itself.

Therefore, it is urgent to develop a thermosetting resin composition having excellent heat resistance with low dielectric characteristics.

PRIOR ART LITERATURE

Patent Literature

Korean Patent Publication No. 2015-0060452 (Jun. 3, 2015), THERMOPLASTIC RESIN COMPOSITION HAVING EXCELLENT HEAT RESISTANCE AND LOW PERMITTIVITY, PREPREG AND COPPER CLAD LAMINATE USING THE SAME, Korean Patent Publication No. 2016-0032075 (Mar. 23, 2013), THERMOPLASTIC RESIN COMPOSITION FOR HIGH FREQUENCY HAVING LOW PERMITTIVITY, PREPREG AND COPPER CLAD LAMINATE USING THE SAME.

DISCLOSURE

Technical Problem

As a result of extensive studies in view of the above, the inventors of the present invention have applied a benzoxazine-based compound having a novel structure to a thermosetting resin composition so as to increase the glass transition temperature of the composition, and as a result, have identified that when the composition is applied to a printed circuit board, it exhibits high heat resistance, low dielectric characteristics, excellent high frequency characteristics and good moisture absorption properties.

Accordingly, it is an object of the present invention to provide a thermosetting resin composition having excellent heat resistance and low dielectric characteristics, a prepreg and a printed circuit board using the composition.

Technical Solution

In order to achieve the above object, the present invention provides a thermosetting resin composition comprising:
  (i) A benzoxazine-based compound having two or more allyl groups at the terminal,
  (ii) an epoxy resin having two or more epoxy rings,
  (iii) an active ester-modified curing agent and
  (iv) a nitrogen-based curing agent.

In addition, the present invention provides a prepreg in which the thermosetting resin composition is impregnated into a fiber substrate.

In addition, the present invention provides a printed circuit board in which the prepreg made of the thermosetting resin composition is laminated and molded in one or more layers.

Advantageous Effects

The thermosetting resin composition according to the present invention comprises a benzoxazine-based compound in the composition to improve the glass transition temperature of the resin composition, thereby increasing the heat resistance and ensuring low dielectric characteristics.

The resin composition does not cause a phenomenon such as breakage during preparation of prepregs, thereby reducing the defective rate of production of parts and improving workability. In addition, the manufactured printed circuit board is excellent in low dielectric loss characteristics, good moisture absorption heat resistance, low thermal expansion characteristics, and thermal stability, and thus even if applied to various parts used in the high frequency range of GHz, it can exhibit excellent insulation characteristics and can be used for a long time without malfunction of the product.

At this time, the part to be used may be various electrical and electronic devices such as mobile communication devices that handle a high frequency signal of GHz or more, or the base station device thereof, and network-related electronic devices such as servers and routers, and large computers.

BEST MODE

The present invention provides a thermosetting resin composition that can be usefully used in printed circuit boards.

The printed circuit boards used in various electronic parts are manufactured through a thermosetting resin composition which improves the low dielectric loss characteristics, good moisture absorption heat resistance, low thermal expansion characteristics, and thermal stability of the printed circuit board by lowering the heat resistance and dielectric constant of the thermosetting resin itself. These physical properties can be achieved to some extent through the use of epoxy-based resins, but are insufficient in terms of heat resistance. Accordingly, the present invention provides a thermosetting resin composition containing a specific composition for increasing heat resistance.

Thermosetting Resin Composition

The thermosetting resin composition according to the present invention comprises (i) a benzoxazine-based compound having two or more allyl groups at the terminal, (ii) an epoxy resin having two or more epoxy rings, (iii) an active ester-modified curing agent and (iv) a nitrogen-based curing agent. Each component will be described in detail below.

(i) benzoxazine-Based Compound

The benzoxazine-based compound has a benzoxazine ring in its molecular structure. The benzoxazine-based compound acts to not only enhance glass transition temperature (Tg) due to the stiffness of the structure itself, but also improve humidity resistance and lower dielectric constant, when added to thermosetting resin. Particularly, the benzoxazine-based compound of the present invention are polymerized by ring opening of benzoxazine and have two or more allyl groups at the terminal, and thus allow self-curing without by-products (e.g., condensation and the like). The free volume of the thermoplastic resin composition is increased due to the bulky side chain by the benzoxazine ring, and thus the dielectric constant is reduced. Also, due to self-curing by the thermal addition polymerization mechanism, the crosslinking density may be increased and thus the heat resistance may be increased. In particular, the benzoxazine ring is formed symmetrically so that the Tg can be further increased with the above-mentioned effect.

Preferably, the benzoxazine-based compounds in the present invention have benzoxazine rings substituted by two or more ally groups at the terminal as shown in the following formula 1 to 4:

[Formula 1]

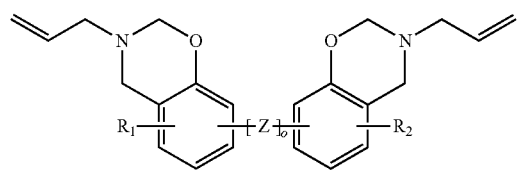

[Formula 2]

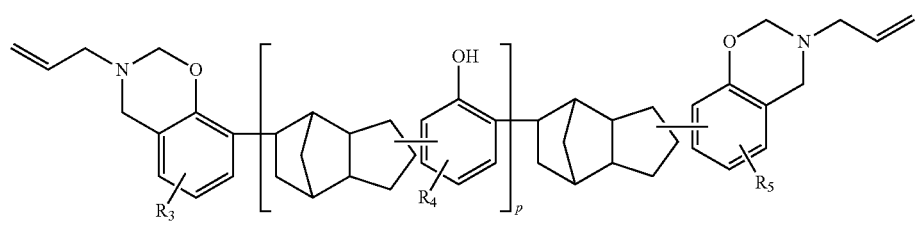

[Formula 3]

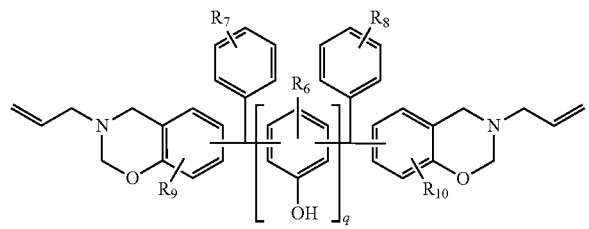

[Formula 4]

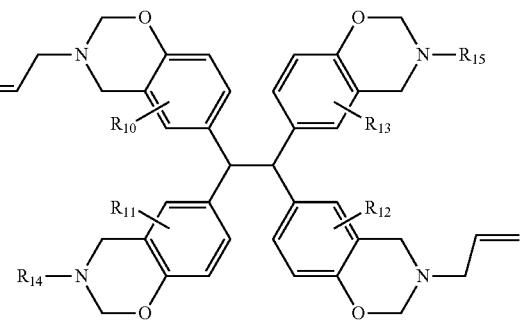

wherein Z is —(S)n- or —R"—(S)n-R"—,

R' and R" are the same or different from each other and each independently are an C1 to C5 alkylene group, n is an integer of 1 to 4, $R_1$ to $R_{13}$ are the same or different from each other and each independently are H, halogen element, a carboxyl group, a C1 to C20 alkyl group, a C3 to C20 cycloalkyl group, a C2 to C20 alkenyl group, a C2 to C20 alkynyl group, a C2 to C20 alkoxy group, a C6 to C20 aryl group, a C7 to C20 aralkyl group or an allyl group, wherein the aryl group or the aralkyl group includes a fused ring, $R_{14}$ and $R_{15}$ are the same or different from each other and each independently are a C6-C20 aryl group, a C7-C20 aralkyl group or an allyl group, o, p, and q are each independently an integer of 0 to 5.

The term "halogen element" as used herein means F, Cl, Br, or I.

The term "alkyl group" as used herein may include a linear or branched alkyl group, and for example, includes methyl, ethyl, propyl, 2-propyl, n-butyl, iso-butyl, tert-butyl, pentyl, hexyl, dodecyl, etc., and when additionally substituted with halogen element, may include fluoromethyl, difluoromethyl, trifluoromethyl, chloromethyl, dichloromethyl, trichloromethyl, iodomethyl, bromomethyl and the like. At this time, the alkylene group means a divalent linking group in which hydrogen atom is missing, the alkenyl group is an alkyl group containing a double bond in a molecular structure and the alkynyl group is an alkyl group containing a triple bond.

The term "cycloalkyl group" as used herein may include monocyclic, bicyclic or tricyclic, and examples thereof may include cyclopropyl, cyclobutyl, cyclopentyl, cyclopentenyl, cyclohexyl, cyclohexenyl, cycloheptyl, cyclooctyl, decahydronaphthalenyl, adamantyl, norbornyl (i.e., bicyclo[2,2,1]hept-5-enyl) and the like.

The term "alkoxy group" as used herein may include a hydroxy group (OH) in the molecular structure, and examples thereof may include methoxy, ethoxy, propoxy, isopropoxy, butoxy, pentoxy, heptoxy, dodecyloxy and the like, and when additionally substituted with halogen, may include fluoromethoxy, difluoromethoxy, trifluoromethoxy, chloromethoxy, dichloromethoxy, trichloromethoxy, iodomethoxy, bromomethoxy and the like.

The terms "aryl group" and "arylene group" as used herein, unless otherwise specified, may have 6 to 60 carbon atoms, respectively, but are not limited thereto. In the present invention, the aryl group or the arylene group means a single ring or a multi-ring aromatic group and includes an aromatic ring which is formed when neighboring substituents are participated in a bond or a reaction. For example, the aryl group may be phenyl group, biphenyl group, terphenyl group, naphthyl group, anthracenyl group, fluorenyl group, a spirobifluorenyl group or a spirobifluorenyl group.

At this time, the prefix "aryl" or "ar" means a radical substituted with an aryl group. For example, the arylalkyl group is an alkyl group substituted with an aryl group, the arylalkenyl group is an alkenyl group substituted with an aryl group, and the radical substituted with an aryl group has the carbon number described in the present specification.

In addition, $R_1$ to $R_{13}$ may substitute for one or two or more hydrogen atoms in the phenyl ring. When substituted by two or more functional groups, it is possible to be substituted with the same functional group or different functional groups. For example, it is possible to be substituted by dimethyl group, methyl group/bromine and the like, respectively.

In the present specification, all the compounds or substituents may be substituted or unsubstituted unless otherwise specified. At this time, the term "substituted" as used herein means that hydrogen is replaced by any one selected from the group consisting of a halogen atom, a hydroxy group, a carboxyl group, a cyano group, a nitro group, an amino group, a thio group, a methylthio group, an alkoxy group, a nitrile group, an aldehyde group, an epoxy group, an ether group, an ester group, a carbonyl group, an acetal group, a ketone group, an alkyl group, a perfluoroalkyl group, a cycloalkyl group, a heterocycloalkyl group, an allyl group, a benzyl group, an aryl group, a heteroaryl group, derivatives thereof and combinations thereof.

Preferably, in Formula 1, Z may be —(S)$_n$—, wherein n may be an integer of 1 to 3; R' and R" may be propyl group.

In addition, $R_1$ to $R_{13}$ may be H, Br, Cl, a C1 to C12 alkyl group, a C1 to C12 alkoxy group, a C6 to C12 aryl group or an allyl group, and more preferably H, a methyl group, an ethyl group, a propyl group, t-butyl group, a hexyl group, an octyl group, an octadecyl group, a dodecyl group, a cumyl group, a phenyl group, a fused phenyl group, a methoxy group, an ethoxy group, a bromomethyl group or an allyl group.

In addition, $R_{14}$ and $R_{15}$ may be a phenyl group or an allyl group.

More preferably, the benzoxazine-based compounds represented by formulas 1 to 4 mentioned above may be compounds represented by formulas 5 to 9 below, respectively:

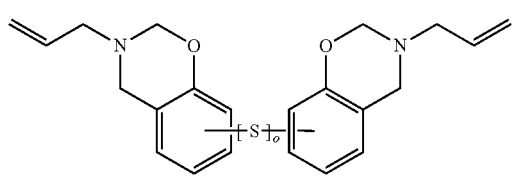

[Formula 5]

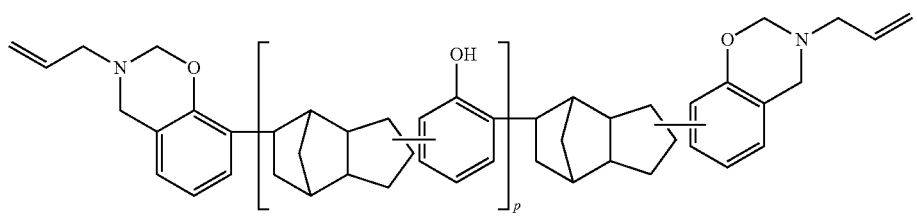

[Formula 6]

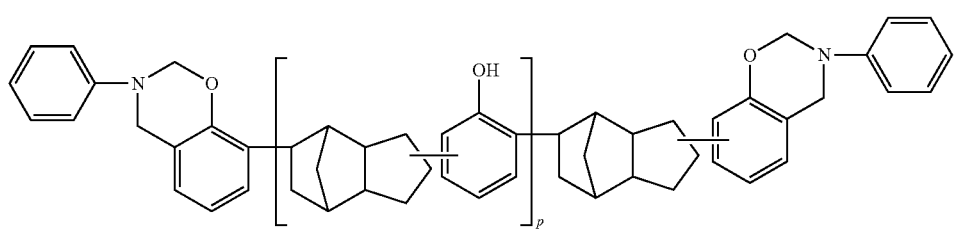

[Formula 7]

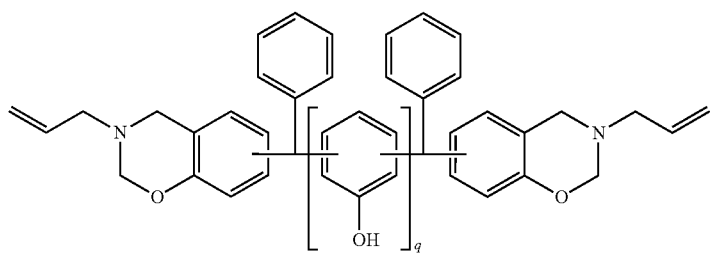

[Formula 8]

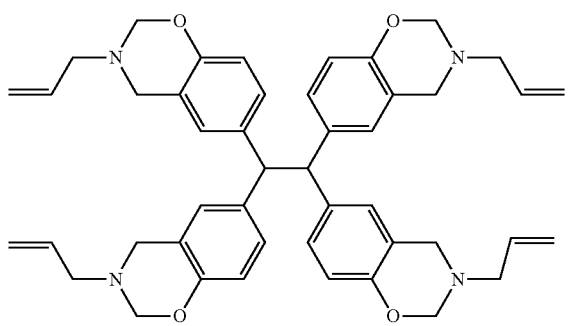

[Formula 9]

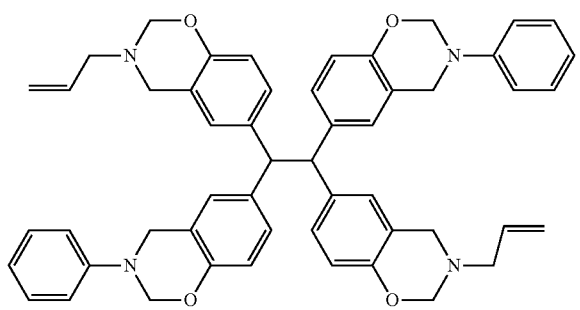

[Formula 10]

wherein o, p, and q are as described above.

The benzoxazine-based compounds represented by the structures described above have low polarity, excellent heat resistance and low dielectric characteristics, and at the same time, are capable of rapidly curing at low temperatures and have high thermal stability, thereby complementing the disadvantages of existing thermosetting resins. Also, for the benzoxazine-based compound, compatibility with epoxy is excellent, flowability is increased at the time of manufacturing laminates, and thus processability is improved and dielectric characteristics is further improved.

In the present invention, the benzoxazine-based compound may be included in an amount of from 5 to 50% by weight, preferably from 5 to 40% by weight based on the total weight of the thermosetting resin composition. When the content is less than the above range, the compatibility with the epoxy resin is low, and effects such as dielectric characteristics cannot be ensured. On the contrary, when the content exceeds the above range, the content of the other components is relatively reduced, thereby making it difficult to produce a product having desired physical properties. Therefore, the content may be appropriately selected within the above range.

(ii) Epoxy Resin

The epoxy resin used in the thermosetting resin composition according to the present invention may be one having at least two epoxy groups for curing.

Preferably, the epoxy resin may include a benzene structure and a hydrocarbon side chain, and preferably have two or more epoxy groups in one molecule. The reason for this is that the epoxy main chain has a cyclic structure and a side chain and has low melt viscosity and high reactivity, and thus heat resistance can be ensured without increasing the other functional groups. Also, since they have a moiety having a symmetric structure and a cyclic structure in its main chain, they have a structure that inhibits the orientation polarization of the polymer itself, and are therefore advantageous for dielectric characteristics.

The epoxy resin may have an epoxy equivalent in the range of from 200 to 2,000 g/eq, preferably from 200 to 1000 g/eq. In addition, the weight average molecular weight (Mw) of the epoxy resin may be in the range of from 1,000 to 20,000 g/mol, preferably in the range of from 1,000 to 10,000 g/mol, and more preferably in the range of from 1,000 to 5,000 g/mol.

The epoxy resin that can be used is not particularly limited in the present invention and those conventionally used in this field can be used.

Preferably, the epoxy resin in the present invention may be dicyclopentadiene (DCPD) epoxy resin. The DCPD epoxy resin is a multi-functional resin having a hydrophobic bicyclic hydrocarbon group and thus has less electron-polarization phenomenon, thereby contributing to lowering the dielectric constant of the copper clad laminate. Preferably, the DCPD epoxy resin may have an epoxy equivalent in the range of from 200 to 500 g/eq. At this time, when the equivalent amount is out of the above range, it is not preferable since there may be problems such as lack of strength of substrate and decrease of heat resistance, and problems such as the foaming phenomenon of the surface of the prepreg and the like.

More preferably, the DCPD-based epoxy resin may be epoxy resins represented by formulas 11 and 12 shown below:

weight of the thermosetting resin composition. When the content of the epoxy resin is less than the above range, the curing ability, the molding processability and the adhesive force are lowered and thus the defective rate of the product is high. On the contrary, when the content exceeds the above range, there is a concern that the physical properties may be deteriorated due to the high degree of curing. Therefore, the content is appropriately adjusted within the range.

A further known epoxy resin may be further used together with the DCPD-based epoxy resin.

For example, bisphenol A type/F type/S type resin, novolac type epoxy resin, alkyl phenol novolac type epoxy resin, biphenyl type, aralkyl type, dicyclopentadiene type or mixed forms thereof may be used. More specifically, examples of these may include bisphenol A type epoxy resin, bisphenol F type epoxy resin, bisphenol S type epoxy resin, naphthalene type epoxy resin, anthracene epoxy resin, biphenyl type epoxy resin, tetramethyl biphenyl type epoxy resin, phenol novolac type epoxy resin, cresol novolac type epoxy resin, bisphenol A novolac type epoxy resin, bisphenol S novolac type epoxy resin, biphenyl novolac type epoxy resin, aromatic hydrocarbon formaldehyde resin modified phenol resin type epoxy resin, triphenyl methane type epoxy resin, tetra phenylethane type epoxy resin, dicyclopentadiene phenol addition reaction type epoxy resin, phenol aralkyl type epoxy resin, multi-functional phenol resin, naphthol aralkyl type epoxy resin. These epoxy resins may be included in an amount of 50% by weight or less based on the DCPD epoxy.

(iii) Active Ester-Modified Curing Agent

The curing agent, which is one of the components constituting the thermosetting resin composition according to the present invention, is a substance that induces crosslinking and thus performs curing.

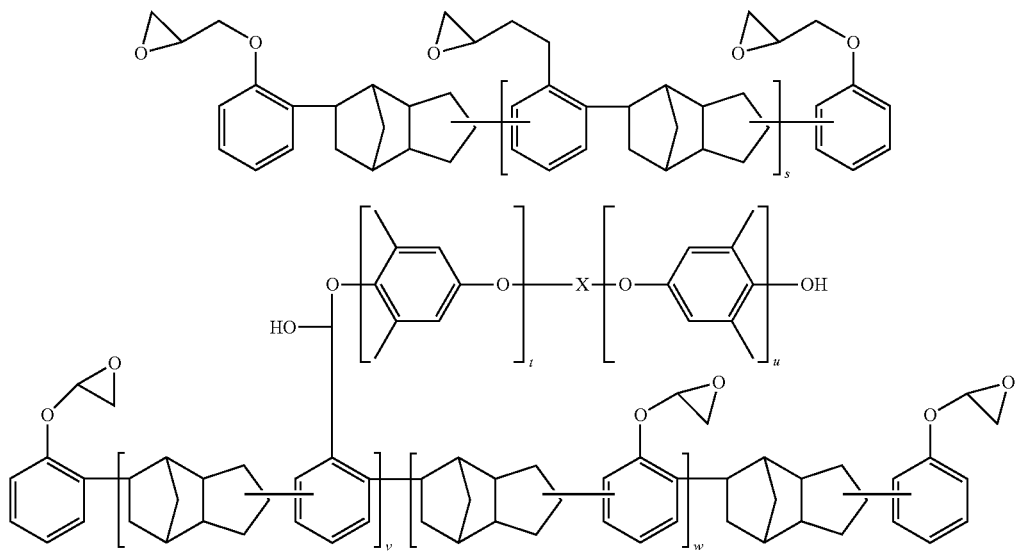

[Formula 11]

[Formula 12]

wherein X is a $C_6$ to $C_{40}$ arylene group, t and u are integers of 1 to 10, and v and w are integers of 1 to 5.

These epoxy resins may affect the curing ability, molding processability and adhesive force of the thermosetting resin composition, and their content is limited in order to obtain optimum effects. Preferably, the epoxy resin may be included in an amount of from 30 to 80% by weight, preferably from 30 to 60% by weight based on the total Preferably, an active ester-modified curing agent is used as the curing agent. The term "active ester modified" as used herein is related to the reactivity with the epoxy resin and refers to a curing agent partially substituted with an ester group. Preferably, the active ester-modified curing agent may comprise at least one selected from the group consisting of a phenol ester-based curing agent, a thiophenol ester-based curing agent, a N-hydroxylamine ester-based curing agent and heterocyclic hydroxy compound ester-based curing agent.

The active ester-modified curing agent can produce products having excellent physical properties (i.e., heat resistance, dielectric characteristics) due to the high curing reactivity between the epoxy group and the ester in the epoxy resin. At this time, the curing reaction makes it possible for the terminal of the molecular structure after curing to be converted to an ester group and to react with the epoxy ring and thus to form an ether group at the terminal, as shown in reaction scheme 1:

[Reaction Scheme 1]

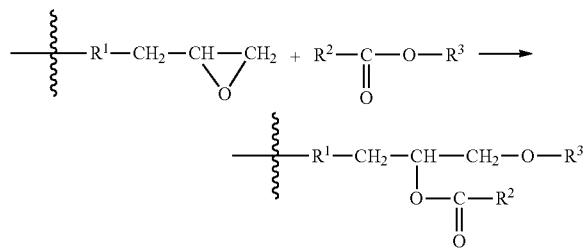

wherein $R^1$ to $R^3$ are aliphatic or aromatic hydrocarbons.

This curing mechanism differs from known amine-based or phenol-based curing agents. That is, the amine-based or phenol-based curing agent has a secondary OH in the molecular structure after curing, and this OH group is polar and thus is an element that increases the dielectric constant, as shown in reaction scheme 2 below. In addition, the secondary OH may react with the epoxy ring again, and may absorb moisture due to hydrophilicity, thereby causing deterioration of physical properties when used as a substrate:

[Reaction Scheme 2]

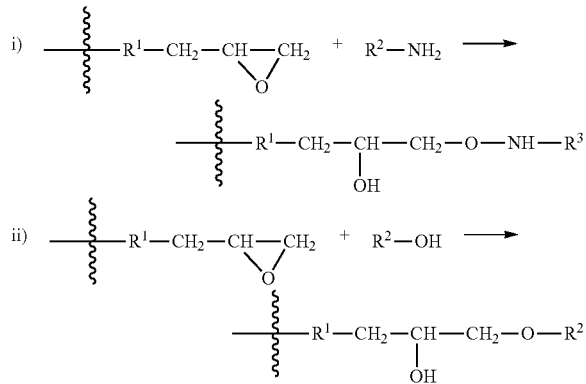

wherein $R^1$ to $R^3$ are aliphatic or aromatic hydrocarbons

Thus, the active ester-modified curing agent of the present invention may be cured without including the OH groups after curing, i.e., may form a network, thereby activating low dielectric characteristics.

Preferably, from the viewpoint of improvement of heat resistance, active ester resins obtained by condensation reaction of a carboxylic acid compound and/or a thiocarboxylic acid compound with a hydroxy compound and/or a thiol compound may be more preferable. An active ester resin obtained by reacting one or two or more selected from a phenol compound, a naphthol compound, and a thiol compound with a carboxylic acid compound may be furthermore preferable. Aromatic resin compounds having two or more active ester groups in one molecule obtained by reacting carboxylic acid compounds with aromatic compounds having a phenolic hydroxyl group may be even more preferred. Aromatic resin compounds obtained by reacting compounds having at least two carboxylic acids in one molecule with aromatic compounds having a phenolic hydroxyl group may be preferable, and also among the aromatic resin compounds, an aromatic resin compound having at least two active ester groups in one molecule may be particularly preferable. The active ester resin may be straight chain or multi-branched chain. Also, when the compound having at least two carboxylic acids in one molecule is a compound containing an aliphatic chain, the compatibility with the resin composition can be increased, and when the compound is a compound having an aromatic ring, the heat resistance can be increased.

Examples of the carboxylic acid compound may specifically include benzoic acid, acetic acid, succinic acid, maleic acid, itaconic acid, phthalic acid, isophthalic acid, terephthalic acid, pyromellitic acid and the like. Among them, from the viewpoint of heat resistance, succinic acid, maleic acid, itaconic acid, phthalic acid, isophthalic acid and terephthalic acid may be preferable, and isophthalic acid and terephthalic acid may be more preferable. Examples of the thiocarboxylic acid compound may specifically include thioacetic acid, thiobenzoic acid, and the like.

Examples of the phenol compound or the naphthol compound may specifically include hydroquinone, resorcin, bisphenol A, bisphenol F, bisphenol S, phenolphthalein, methylated bisphenol A, methylated bisphenol F, methylated bisphenol S, phenol, o-cresol, m-cresol, p-cresol, catechol, α-naphthol, β-naphthol, 1,5-dihydroxynaphthalene, 1,6-dihydroxynaphthalene, 2,6-dihydroxynaphthalene, dihydroxybenzophenone, trihydroxybenzophenone, tetrahydroxybenzophenone, phloroglucin, benzenetriol, dicyclopentadienyldiphenol, phenolnovolac and the like. Among them, from the viewpoint of improvement of heat resistance and improvement of solubility, bisphenol A, bisphenol F, bisphenol S, methylated bisphenol A, methylated bisphenol F, methylated bisphenol S, catechol, α-naphthol, β-naphthol, 1,5-dihydroxynaphthalene, 1,6-dihydroxynaphthalene, 2,6-dihydroxynaphthalene, dihydroxybenzophenone, trihydroxybenzophenone, tetrahydroxybenzophenone, phloroglucin, benzenetriol, dicyclopentadienyldiphenol and phenolnovolac may be preferable, catechol, 1,5-dohydroxynaphthalene, 1,6-dihydroxynaphthalene, 2,6-dihydroxynaphthalene, dihydroxybenzophenone, trihydroxybenzophenone, tetrahydroxybenzophenone, phloroglucin, benzenetriol, dicyclopentadienyldiphenol and phenolnovolac may be more preferable, and 1,5-dihydroxynaphthalene, 1,6-dihydroxynaphthalene, 2,6-dihydroxynaphthalene, dihydroxybenzophenone, trihydroxybenzophenone, tetrahydroxybenzophenone, dicyclopentadienyldiphenol and phenolnovolac may be more preferable, and 1,5-dihydroxynaphthalene, 1,6-dihydroxynaphthalene, 2,6-dihydroxynaphthalene, dicyclopentadienyldiphenol, and phenolnovolac may be further more preferable, and 1,5-dihydroxynaphthalene, 1,6-dihydroxynaphthalene, 2,6-dihydroxynaphthalene, dicyclopentadienyldiphenol are particularly preferable, and dicyclopentadienyldiphenol is more particularly preferable. Examples of thiol compound may specifically include benzenedithiol, triazinedithiol and the like.

The active ester-modified curing agent may be preferably an active ester resin containing a dicyclopentadienyldiphenol structure, an active ester resin containing a naphthalene structure, an active ester resin containing an acetylide of phenolnovolac, and an active ester resin containing a benzoylide of phenolnovolac, and among them, an active ester resin containing a naphthalene structure and an active ester resin containing a dicyclopentadienyldiphenol structure may be more preferable. Commercially available products thereof may be EXB9451, EXB9460, EXB9460S: HPC-8000-65T (manufactured by DIC (KK)) as active ester resin containing dicyclopentadienyldiphenol structure, EXB9416-70BK (manufactured by DIC Corporation) as an active ester resin containing a naphthalene structure, DC808 (manufactured by Mitsubishi Chemical Corporation) as an active ester resin containing an acetylide of phenolnovolac, YLH1026 (manufactured by Mitsubishi Chemical Corporation) as an active ester resin containing benzoylide of phenolnovolac and the like.

Preferably, the active ester-modified curing agent of the present invention may be HPC-8000-65T, which is an active ester resin having a dicyclopentadienyldiphenol structure represented by the following formula 13, having an X-group and an XO-group (wherein X is a naphthyl group which may have a substituent) at the terminal and having a weight average molecular weight of about 2700 g/mol:

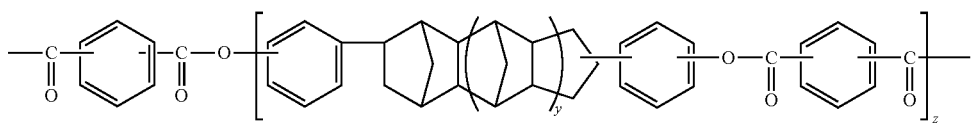

[Formula 13]

wherein y is 0 or 1, z is 0.4 to 1.2.

The active ester-modified curing agent may be included in an amount of from 5 to 30% by weight, preferably from 7 to 25% by weight based on the total weight of the thermosetting resin composition. When the content is less than the above range, the functional group of the epoxy terminal is minimized and the effect of reducing the polar group is insufficient. As the content is increased, the low dielectric loss characteristic is better and the low dielectric effect is exhibited. However, when the content exceeds the above range, there may arises a problem of lowering workability due to the problem of low Tg and the problem of slow reactivity (curing rate) of the composition.

(iv) Nitrogen-Based Curing Agent

In addition, the thermosetting resin composition according to the present invention further comprises a nitrogen-based curing agent together with the active ester-modified curing agent.

The nitrogen-based curing agent may comprise at least one selected from the group consisting of an amine-based curing agent, a triazine-phenol-based curing agent, a carbodiimide-based curing agent, and a cyanate ester-based curing agent.

The amine-based curing agent may be, for example, aliphatic amines, polyetherpolyamines, alicyclic amines, aromatic amines. The aliphatic amines may be ethylenediamine, 1,3-diaminopropane, 1,4-diaminopropane, hexamethylenediamine, 2,5-dimethylhexamethylenediamine, triethylhexamethylenediamine, diethylenetriamine, aminobispropylamine, bis(hexamethylene)triamine, triethylenetetramine, tetraethylenephenamine, pent aethylenehexamine, N-hydroxyethylethylenediamine, tetra(hydroxyethyl)ethylenediamine and the like. The polyetherpolyamines may be one selected from triethyleneglycoldiamine, tetraethyleneglycoldiamine, diethyleneglycolbis(propylamine), polyoxypropylenediamine, polyoxypropylenetriamines and mixtures thereof. The alicyclic amines may be isophoronediamine, metacendiamine, N-aminoethylpiperazine, bis(4-amino-3-methyldicyclohexyl)methane, bis(aminomethyl) cyclohexane, 3,9-bis(3-aminopropyl)2,4,8,10-tetraoxaspiro (5,5)undecane, norbornen diamine and the like. The aromatic amines may be one selected from tetrachloro-p-xylenediamine, m-xylenediamine, p-xylenediamine, m-phenylenediamine, o-phenylenediamine, p-phenylenediamine, 2,4-diaminoanisole, 2,4-toluenediamine, 2,4-diaminodiphenylmethane, 4,4'-diaminodiphenylmethane, 4,4'-diamino-1, 2-diphenylethane, 2,4-diaminodiphenylsulfone, m-aminophenol, m-aminobenzylamine, benzyldimethylamine, 2-dimethylaminomethyl)phenol, triethanolamine, methylbenzylamine, α-(m-aminophenyl)ethylamine, α-(p-aminophenyl)ethylamine, diaminodiethyldimethyldiphenylmethane, α,α'-bis(4-aminophenyl)-p-diisopropylbenzene and mixtures thereof.

The triazine-phenol-based curing agent may comprise preferably those having two or more, three or more, or four or more triazine structures in one molecule, and may be more preferably those containing at least 2, at least 3, or at least 4 phenolic hydroxyl groups in one molecule. One type of the triazine structure-containing phenol-based curing agent may be used alone or two or more type of triazine structure-containing phenol-based curing agents can be used in combination.

The triazine structure-containing phenol-based curing agent may be prepared, for example, by reacting at least one selected from the group consisting of a phenol compound and a naphthol compound, a triazine ring-containing compound such as melamine, benzoguanamine and acetoguanamine, and formaldehyde. Examples of commercially available products of such curing agents may include 「LA-3018」 (cresolnovolac type curing agent containing a triazine structure) manufactured by DIC Corporation, 「LA-7052」, 「LA-7054」, 「LA-1356」 (phenolnovolac type curing agent containing a triazine structure) manufactured by DIC Corporation, and the like.

Specific examples of the carbodiimide-based curing agent may include 「V-03」, 「V-07」 manufactured by Nisshinbo Chemical Co., Ltd. and the like The cyanate ester-based curing agent is not particularly limited, but examples thereof may include novolac type (phenolnovolac type, alkyl phenolnovolac type, etc.) cyanate ester-based curing agent, dicyclopentadiene type cyanate ester-based curing agent, bisphenol type (bisphenol A type, bisphenol F type, bisphenol S type, etc.) cyanate ester-based curing agent, partially triazinated prepolymer thereof and the like. Specific examples thereof may include bifunctional cyanate resin such as bisphenol A dicyanate, polyphenolcyanate(oligo(3-methylene-1,5-phenylenecyanate)), 4,4'-methylenebis(2,6-dimethylphenylcyanate), 4,4'-ethylidenediphenyldicyanate, hexafluorobisphenol A dicyanate, 2,2-bis(4-cyanate)phenylpropane, 1,1-bis(4-cyanatephenylmethane), bis(4-cyanate-3,5-dimethylphenyl) methane, 1,3-bis(4-cyanatephenyl-1-(methylethylidene) benzene, bis(4-cyanatephenyl)thioether and bis(4-cyanatephenyl)ether, multi-functional cyanate resin derived from phenolnovolac, cresolnovolac and the like, partially triazinated prepolymer of these cyanate resin and the like. Specific examples of the cyanate ester-based curing agent may include ⌈PT30⌋, ⌈PT30S⌋ and ⌈PT60⌋ (both phenolnovolac type multi-functional cyanate ester resins) manufactured by Lonza Japan Ltd., ⌈BADcy⌋ (bisphenol A dicyanate), ⌈BA230⌋ (a prepolymer in which some or all of bisphenol A dicyanate is triazinated and trimerized), and the like.

Another type of the curing agent may include latent amine curing components. The latent curing agent means that the curing component does not react at room temperature but rapidly reacts to cure when the initiation temperature for the epoxy curing reaction is exceeded. This type makes it easy to apply at room temperature or by suitably heating without activating the curing agent by the adhesive for construction Example of the suitable latent curing amine may include guanidine, substituted guanidine (such as, methylguanidine, dimethylguanidine, trimethylguanidine, tetramethylguanidine, methylisobiguanidine, dimethylisobiguanidine, tetramethylisobiguanidine, hexamethylisobiguanidine, heptamethylisobiguanidine and dicyandiamide), melamine resin, guanamine derivatives (such as, alkylated benzoguanamine resin, benzoguanamine resin and methoxymethylethoxymethylbenzoguanamine), cyclic tert-amine, aromatic amine, substituted urea (such as, p-chlorophenyl-N,N-dimethylurea (monuron), 3-phenyl-1,1-dimethylurea (phenuron), 3,4-dichlorophenyl-N,N-dimethylurea (diuron)), tert-acryl- or alkyl-amine (such as, benzyldimethylamine, tris(dimethylamino)phenol, piperidine and piperidine derivatives), imidazole derivatives (such as, 2-ethyl-2-methylimidazole, N-butylimidazole, benzimidazole, N-C1-C12-alkylimidazole and N-arylimidazole), and combinations thereof. Examples of the commercially available latent amines may include Adeka hardener series (EH-3615, EH-3842 and EH-4342S) available from Adeka Corp. of Japan and Ajicure series (PN-40J), available from Ajinomoto Corp. of Japan.

This additional curing agent may be included in an amount of from 0.0001 to 5% by weight, preferably from 0.0005 to 4% by weight based on the total weight of the thermosetting resin composition. When the content exceeds the above range, it is difficult to control the curing rate and to produce products having desired physical properties due to the excessive curing. Therefore, the content is appropriately selected within the above range.

The thermosetting resin composition according to the present invention may include, in addition to the above-mentioned components, various components known in the art, for example, various additives.

For example, conventional flame retardants known in the art may be used without limitation as flame retardant. The flame retardant may be, for example, halogen flame retardants containing bromine or chlorine, phosphorous-based flame retardants such as triphenyl phosphate, tricrecylphosphate, trisdichloropropyl phosphate, and phosphazene, antimony-based flame retardants such as antimony trioxide, flame retardants of inorganic substances such as aluminum hydroxide and magnesium hydroxide and the like Preferably, in the present invention, an addition type phosphorous-based flame retardant which does not deteriorate heat resistance and dielectric characteristics may be used. In the thermosetting resin composition, the content of the flame retardant may be in the range of from 10 to 30 parts by weight, preferably in the range of from 15 to 25 parts by weight based on 100 parts by weight of the entire thermosetting resin composition. When the flame retardant is included in the above range, sufficient flame resistance of a flame retardant level of 94V-0 can be achieved and excellent thermal resistance and electrical characteristics can be exhibited.

The inorganic filler may reduce the difference in thermal expansion coefficient (CTE) between the resin layer and the other layer, and thus flexural properties, low expansion, mechanical strength (toughness) and lowering of stress of the final product may be effectively improved.

Non-limiting examples of inorganic fillers that can be used in the present invention may include silica such as natural silica, fused silica, amorphous silica, and crystalline silica; boehmite, alumina, talc, spherical glass, calcium carbonate, magnesium carbonate, magnesia, clay, calcium silicate, titanium oxide, antimony oxide, glass fiber, aluminum borate, barium titanate, strontium titanate, calcium titanate, magnesium titanate, bismuth titanate, titanium oxide, barium zirconate, calcium zirconate, boron nitride, silicon nitride, talc, mica and the like. One type of these filler can be used alone or two or more types may be used in combination.

The curing accelerator is not particularly limited, and examples thereof may be an imidazole-based curing accelerator, an amine-based curing accelerator, a phosphorus-based curing accelerator, a guanidine-based curing accelerator, and a metal-based curing accelerator. As the curing accelerator, one type of curing accelerator may be used alone, or two or more types may be used in combination.

For example, the curing accelerator may be one commonly used in the field to which the present invention pertains, and examples thereof may be imidazole-based compounds such as imidazole, 2-methyl imidazole(2MI), 2-ethylimidazole, 2-decylimidazole, 2-hexylimidazole, 2-isopropylimidazole 2-undecyl imidazole, 2-heptandecyl imidazole, 2-ethyl-4-methyl imidazole, 2-phenylimidazole, 2-phenyl-4-methyl imidazole, 1-benzyl-2-methyl imidazole, 1-benzyl-2-phenyl imidazole, 1-cyanoethyl-2-methylimidazole, 1-cyanoethyl-2-ethyl-4-methylimidazole, 1-cyanoethyl-2-undecylimidazole, 1-cyanoethyl-2-phenylimidazole, 1-cyanoethyl-2-undecylimidazole trimellitate, 1-cyanoethyl-2-phenyl imidazole trimellitate, 2,4-diamino-6-(2'-methylimidazole-(1'))-ethyl-s-triazine, 2,4-diamino-6-(2'ethyl-4-methylimidazole-(1'))-ethyl-s-triazine, 2,4-diamino-6-(2'-undecylimidazole-(1'))-ethyl-s-triazine, 2-phenyl-4,5-dihydroxymethylimidazole, 2-phenyl-4-methyl-5-hydroxymethylimidazole, 2-phenyl-4-benzyl-5-hydroxymethylimidazole, 4,4'-methylene-bis-(2-ethyl-5-methylimidazole), 2-aminoethyl-2-methyl imidazole, 1-cyanoethyl-2-phenyl-4,5-di(cyanoethoxy methyl)imidazole, 1-dodecyl-2-methyl-3-benzylimidazole lithium chloride, ethytriphenylphosphonium iodide (ETPPI), or imidazole containing polyamide; boric acid or the like. and one type of curing accelerator may be used alone, or two or more types of curing accelerators may be used in combination Since there are various curing systems such as epoxy resin and amide-based curing agent, epoxy resin and active ester curing agent, or epoxy resin and benzoxazine curing agent, more preferably, the curing accelerator proposed in the present invention may be selectively used DMAP used in the use of an active ester curing agent, 3,3'-thiodipropionic acid, 4,4'-thiodiphenol, etc., which are used as benzoxazine curing accelerator, including imidazole-based curing accelerators such as 2-ethyl-4-methyl imidazole or 2-methyl imidazole commonly used in epoxy resins, but are not limited thereto.

The thermosetting resin composition according to the present invention may further comprise a reaction initiator to enhance the beneficial effect of the cross-linkable curing agent.

Non-limiting examples of reaction initiators that can be used may include α,α'-bis(t-butylperoxy-m-isopropyl)benzene, 2,5-dimethyl-2,5-di(t-butylperoxy)-3-hexyne, benzoylperoxide, 3,3',5,5'-tetramethyl-1,4-diphenoxyquinone, chloranil, 2,4,6-tri-t-butylphenoxyl, t-butylperoxyisopropyl monocarbonate, and azobisisobutylonitrile. Further, a metal carboxylate salt may further be used. The reaction initiator may be included in an amount of from 2 to 5 parts by weight based on 100 parts by weight of the thermosetting resin composition, but is not limited thereto.

In addition to the above components, the thermosetting resin composition of the present invention may further contain other additives such as various polymers such as thermosetting resins or thermoplastic resins and their oligomers which are not described above, solid rubber particles or ultraviolet absorbers, catalysts, antioxidants, dyes, pigments, dispersants, thickeners, leveling agents and the like, as needed, as long as the intrinsic properties of the resin composition are not impaired. For example, there are an organic amine catalyst such as 4-dimethylamino pyridine (DMAP), organic fillers such as silicone-based powder, nylon powder and fluororesin powder, thickeners such as orben and benton; polymeric antifoaming agents or leveling agents such as silicon-based, fluoropolymer-based, etc.; adhesion imparting agents such as imidazole-based, triazole-based, triazole-based, and silane-based coupling agents; and coloring agents such as phthalocyanine and carbon black.

The thermosetting resin composition may include a thermoplastic resin for the purpose of imparting appropriate flexibility to the resin composition after curing. Examples of such a thermoplastic resin may include phenoxy resin, polyvinyl acetal resin, polyimide, polyamideimide, polyether sulfone, and polysulfone. As these thermoplastic resins, any one type of resin may be used alone, or two or more kinds of resins may be used in combination.

Examples of the resin additive may include organic fillers such as silicon powder, nylon powder, and fluorine powder; thickeners such as orben and benton; antifoaming agents or leveling agents such as silicon-based and fluorine-based and polymer-based; adhesion imparting agents such as imidazole-based, triazole-based, triazole-based, silane coupling agents, epoxy silanes, amino silanes, and alkyl silanes; coloring agents such as phthalocyanine blue, phthalocyanine green, iodine green, disazo yellow and carbon black; releasing agents such as higher fatty acids, higher fatty acid metal salts and ester-based waxes; and stress relieving agents such as denatured silicone oil, silicone powder, and silicone resin and the like. In addition, additives commonly used in thermosetting resin compositions used in the production of electronic devices (particularly, printed wiring board) may be included.

Preparation of Thermosetting Resin Composition

The thermosetting resin composition of the present invention may be prepared by appropriately mixing the above components and also kneading or mixing, as needed, by a kneading means such as a 3 rolls, a ball mill, a bead mill or a sand mill, or a stirring means such as a high-speed rotary mixer, a super mixer or a planetary mixer. Further, by further adding the above-mentioned organic solvent, a resin varnish can also be prepared.

The form of the thermosetting resin composition of the present invention is not particularly limited, but it can be applied to a sheet-like laminated material such as an adhesive film and a prepreg, and a circuit board (for use in a laminate board and a multilayer printed wiring board, and the like). The resin composition of the present invention may be applied to a circuit board in a varnish state to form an insulating layer, but it is generally industrially preferable to use it in the form of a sheet-like laminated material such as an adhesive film and a prepreg. The softening point of the resin composition is preferably from 40 to 150 □ from the viewpoint of the lamination property of the sheet-like laminated material.

Prepreg

The prepreg of the present invention comprises a fiber substrate and the above-described thermosetting resin composition impregnated into the fiber substrate. At this time, the thermosetting resin composition may also be a resin varnish which is a form dissolved or dispersed in a solvent.

The fiber substrate may be an inorganic fiber substrate, an organic fiber substrate, or a mixed form thereof, which are optionally flexible and capable of being bent and are customary in the art. Based on the intended use or performance, the above-mentioned fiber substrate can be selected.

Non-limiting examples of usable fiber substrates may include glass fibers (inorganic fibers) such as E-glass, D-glass, S-glass, NE-glass, T-glass and Q-glass; glass papers, glass fiber non-woven fabrics (glass web), glass fabrics (glass cloth); organic fibers such as aramid fibers, aramid paper, polyimides, polyamides, polyesters, aromatic polyesters, fluororesins and the like; carbon fiber, paper, inorganic fiber, or mixtures thereof. The form of the fiber substrate may be a woven or nonwoven fabric made of the above-mentioned fibers or the like; roving, chopped strand mat, surfacing mat; woven fabrics, non-woven fabrics, mats made of metal fibers, carbon fibers, mineral fibers and the like. One type of substrate among these substrates may be used alone, or two or more types of substrates may be used in combination. When the reinforced fiber substrate is used in combination, the rigidity and dimensional stability of the prepreg can be improved. The thickness of such a fiber substrate is not particularly limited, and may range, for example, from about 0.01 mm to 0.3 mm.

The resin composition is used for forming a prepreg, and the thermosetting resin composition of the present invention can be used.

Typically, the prepreg refers to a sheet-like material obtained by coating or impregnating a fiber substrate with a thermosetting resin composition and then curing to a B-stage (semi-cured state) by heating. In addition to the above-mentioned method, the prepreg of the present invention can be produced by a known hot-melt method, a solvent method or the like known in the art.

The solvent method is a method of impregnating a resin substrate into a resin composition varnish, which is formed by dissolving the thermosetting resin composition for prepreg formation in an organic solvent, and then drying them. When such a solvent method is employed, a resin varnish is generally used. Examples of the method of impregnating the resin composition into a fiber substrate may include a method of immersing the substrate in a resin varnish, a method of applying resin varnish to a substrate by various coaters, a method of spraying resin varnish onto substrate by spraying and the like. At this time, when the fiber substrate is immersed in the resin varnish, the impregnability of the resin composition to the fiber substrate can be improved and thus it is preferable.

When the resin composition varnish is prepared, examples of the organic solvent may include ketones such as acetone, methylethylketone and cyclohexanone, acetic acid esters such as ethyl acetate, butyl acetate, cellosolve acetate, propylene glycol monomethylether acetate and carbitol acetate, cellosolve, carbitols such as butyl carbitol, aromatic hydrocarbons such as toluene and xylene, dimethyl formamide, dimethyl acetamide, N-methyl pyrrolidone, tetrahydrofuran and the like. As the organic solvent, one type of organic solvent among the organic solvents may be used alone, or two or more types of organic solvents may be used in combination.

In addition, the hot melt method may be a method in which the resin composition is coated on a release paper having excellent releasability from the resin composition without dissolving the resin composition in an organic solvent and then laminated on a sheet-like fiber substrate, or directly coated by a die coater. Also, it may be produced by continuously thermal-laminating an adhesive film comprising a thermosetting resin composition laminated on a support from both sides of the sheet-like reinforcing substrate under heating and pressing conditions The resin composition of the present invention may be prepared into a prepreg by coating or impregnating the resin composition on a sheet-like fiber substrate or glass substrate made of fibers and semi-curing the composition by heating. It may be preferably a prepreg for a printed circuit board. The resin composition may be prepared as a resin varnish.

The prepreg of the present invention may be formed by coating or impregnating to the substrate and then further drying, wherein the drying may be performed at from 20 to 200 □. For example, the prepreg of the present invention can be prepared by impregnating the substrate with the thermosetting resin composition varnish and heating and drying at from 70 to 170 □ for from 1 to 10 minutes to prepare a prepreg in a semi-cured (B-stage) state.

Printed Circuit Board

The present invention includes a printed circuit board formed by superimposing one or more, preferably two or more of the above-mentioned prepregs, and heating and pressing them under normal conditions.

The printed circuit board may be manufactured by a conventional method known in the art. In a preferred example thereof, the printed circuit board may be prepared by laminating a copper foil on one side or both sides of a prepreg according to the present invention, heating and pressing to produce a copper clad laminate, and then etching the copper foil containing the plated film to form a circuit.

At this time, the heating and pressing conditions may be appropriately adjusted depending on the thickness of the laminate to be manufactured, the kind of the thermosetting resin composition according to the present invention, and the like. For example, the pressing may be carried out in the conditions of a temperature of from 70 to 250 □, preferably from 100 to 230 □, a reduced pressure of usually 0.01 MPa or less, preferably 0.001 MPa or less, a pressing pressure in the range of from 0.5 to 4 MPa and a pressing time of from 30 to 150 minutes. Heating and pressing may be carried out in one step, but it is preferable to divide the conditions into two or more stages from the viewpoint of controlling the leakage of the resin.

It was confirmed that the printed circuit board proposed in the present invention has low dielectric constant and dielectric loss as well as low thermal expansion coefficient (CTE), high glass transition temperature (Tg) and excellent heat resistance (see table 2 below). Accordingly, the prepreg and the printed circuit board of the present invention may be usefully used as a component of a printed circuit board for a network for use in various electrical and electronic devices such as mobile communication devices that handle a high frequency signal of GHz or more, or the base station device thereof, and network-related electronic devices such as servers and routers, and large computers.

Hereinafter, the present, invention will be described in detail with reference to Examples. However, the following Examples and Experimental Examples are merely illustrative of the present invention, and the scope of the present invention is not limited by the following Examples and Experimental Examples.

EXAMPLES

Examples 1 to 5 and Comparative Examples 1 to 3

The components shown in Table 1 below were added to the reactor and uniformly mixed to prepare a thermosetting resin composition.

The prepared thermosetting resin composition was impregnated with glass fiber and dried at 155 □ for 5 to 30 minutes to prepare prepreg. Then, the prepreg was laminated 4 ply and pressed to obtain a laminated thin plate having a thickness of 0.8 to 1.2 mm.

TABLE 1

| Component (wt. %) | | Example 1 | Example 2 | Example 3 | Example 4 | Example 5 | Comparative Example 1 | Comparative Example 2 | Comparative Example 3 |
|---|---|---|---|---|---|---|---|---|---|
| Benzoxazine-based compound | KZH-5031[1)] | 10.5 | 18.7 | 29.8 | 0 | 0 | 0 | 0 | 27.6 |
| | KZH-5021[2)] | 0 | 0 | 0 | 29.8 | 0 | 0 | 0 | 0 |
| | TPE BZX[3)] | 0 | 0 | 0 | 0 | 29.8 | 0 | 0 | 0 |
| | KZH-5032[4)] | 0 | 0 | 0 | 0 | 0 | 0 | 18.7 | 0 |
| Epoxy resin | KES-7695[5)] | 52.5 | 46.7 | 37.2 | 37.2 | 37.2 | 61.3 | 46.7 | 49.2 |
| curing agent | HPC-8000-65T[6)] | 15.7 | 14 | 11.2 | 11.2 | 11.2 | 18.4 | 14 | 0 |
| | DICY[7)] | 0.5 | 0.5 | 0.4 | 0.4 | 0.4 | 0.6 | 0.5 | 1.5 |
| Curing accelerator | DMAP[8)] | 0.04 | 0.04 | 0.03 | 0.03 | 0.03 | 0.05 | 0.04 | 0 |
| | 2-MI[9)] | 0.026 | 0.023 | 0.019 | 0.019 | 0.019 | 0.031 | 0.023 | 0.025 |
| | TDPA[10)] | 0.7 | 1.3 | 2.1 | 2.1 | 2.1 | 0 | 1.3 | 2.0 |

TABLE 1-continued

| Component (wt. %) | | Example 1 | Example 2 | Example 3 | Example 4 | Example 5 | Comparative Example 1 | Comparative Example 2 | Comparative Example 3 |
|---|---|---|---|---|---|---|---|---|---|
| Flame retardant | KGH-3200[11] | 19.9 | 18.7 | 19.4 | 19.4 | 19.4 | 19.6 | 18.7 | 19.7 |
| | total | 100 | 100 | 100 | 100 | 100 | 100 | 100 | 100 |

[1] KZH-5031: Compound of formula 6, DCPD-based benzoxazine
[2] KZH-5021: Compound of formula 8, benzaldehyde novolac benzoxazine
[3] TPE BZX: Compound of formula 9, tetraphenyl benzoxazine,
[4] KZH-5032: Compound of formula 7, DCPD-based benzoxazine
[5] KES-7695: DCPD-based resin, epoxy equivalent, 270 g/eq
[6] HPC-8000-65T: activated ester resin, equivalent 223 g/eq, product from DIC
[7] DICY: Dicyandiamide
[8] DMAP: Dimethylaminopyridine
[9] 2-MI: 2-methyl imidazole
[10] TDPA: 3,3'-thiodipropionic acid
[11] KGH-3200: KGH-3200 (400 g/eq)

Experimental Example 1: Measurement and Analysis of Physical Properties

The following experiments were performed on the printed circuit boards manufactured in Examples and Comparative Examples, and the results are shown in table 2 below.

1) Heat Resistance

According to the evaluation standard of IPC TM-650 2.4.13, the heat resistance was evaluated by floating the printed circuit board at Solder 288 □ and measuring the time until the separation between the insulating layer and the copper foil, between the insulating layer and the metal core or between the insulating layers is occurred 2) Adhesiveness to Copper Foil (Peel Strength, P/S)

According to the evaluation standard of IPC-TM-650 2.4.8, the peel strength was evaluated by measuring the time the time at which the circuit pattern (copper foil) is peeled off by pulling up the circuit pattern formed on the printed circuit board from 90 degrees.

3) Evaluation of Flame Retardancy

The flame retardancy was evaluated in accordance with the test method (V method) of UL94 after manufacturing the evaluation substrate with the length of 127 mm and the width of 12.7 mm from the substrate from which the copper foil was removed by impregnating the copper clad laminate with the copper etching solution, 4) TMA Glass Transition Temperature The glass transition temperature was evaluated by preparing an evaluation substrate of 5 mm in each side from the substrate from which the copper foil was removed by impregnating the copper clad laminate with copper etching solution and then observing the thermal expansion characteristics of the evaluation substrate using a TMA tester (TA Instrument, Q400).

5) Evaluation of Moisture Absorption Heat Resistance (PCT)

The moisture absorption heat resistance was evaluated by impregnating copper clad laminates with copper etching solution to prepare a copper foil removed evaluation substrate, standing for 4 hours at 121 □ and 0.2 MPa using a pressure cooker (ESPEC, EHS-411MD), and then measuring the time until the separation between the insulating layer and the copper foil, between the insulating layer and the metal core or between the insulating layers is occurred while dipping the printed circuit board at solder 288□ at intervals of 10 seconds.

6) Specific Dielectric Constant and Dielectric Tangent

The specific dielectric constant and dielectric tangent at a frequency of 1 GHz were measured by a specific dielectric constant measuring device (RF Impedence/Material Analyzer; Agilent) using the substrate on which the copper foil was removed by impregnating the copper clad laminate with the copper etching solution.

7) Glass Transition Temperature (Tg)

A sample of about 5 mg was heated to 300 □ at a rate of 10 □/min by DSC 2010 and DSC 2910 from TA Instruments as a DSC measuring instrument and then cooled to 30 □ at a rate of 10 □/min. This first heating/cooling process was carried out twice in the same process.

8) Absorption Rate (W/A)

The dry weight after drying in an oven at 50 □ for 24 hours was measured using a test piece cut into 50 mm×50 mm, and subsequently, the weight after storage for 72 hours in a treatment tank adjusted to 85 □/85% RH was measured.

TABLE 2

| | Example 1 | Example 2 | Example 3 | Example 4 | Example 5 | Comparative Example 1 | Comparative Example 2 | Comparative Example 3 |
|---|---|---|---|---|---|---|---|---|
| DSC Tg (□) | 169.4 | 172.5 | 179.4 | 175.6 | 174.6 | 155.4 | 164.6 | 175.4 |
| W/A | 0.31 | 0.3 | 0.29 | 0.28 | 0.29 | 0.42 | 0.3 | 0.41 |
| Solder Floting (@288□) | OK | OK | OK | OK | OK | OK | OK | OK |
| PCT | OK | OK | OK | OK | OK | OK | OK | OK |
| Dielectric constant (Dk @ 1 GHz) | 3.57 | 3.54 | 3.56 | 3.67 | 3.7 | 3.51 | 4.01 | 4.25 |

TABLE 2-continued

| | Example 1 | Example 2 | Example 3 | Example 4 | Example 5 | Comparative Example 1 | Comparative Example 2 | Comparative Example 3 |
|---|---|---|---|---|---|---|---|---|
| Dielectric tangent (Df @ 1 GHz) | 0.0066 | 0.0064 | 0.0067 | 0.0075 | 0.0078 | 0.0059 | 0.01 | 0.01 |
| Flame retardancy | V-0 | V-0 | V-0 | V-0 | V-0 | V-0 | V-0 | V-0 |
| P/S (kgf/cm) | 0.88 | 0.94 | 0.95 | 0.84 | 0.89 | 0.79 | 0.92 | 0.85 |

Referring to Table 2 above, when using a thermosetting resin composition containing both a benzoxazine-based compound and an active ester-based curing agent according to the present invention, excellent values were obtained for all physical properties.

In comparison, as in Example 1, when benzoxazine-based compounds were not used, the hygroscopicity was high with low Tg, which indicated a rise in dielectric constant.

In addition, as in Comparative Example 2, when the benzoxazine-based compound containing no allyl group was used, the Tg tended to increase slightly, which also indicated a rise in dielectric constant.

In addition, as in Example 3, when using benzoxazine-based compounds containing allyl but not using an active ester-based curing agent, the dielectric constant was increased.

INDUSTRIAL APPLICABILITY

The thermosetting resin composition according to the present invention and the substrate thus produced have low dielectric characteristics and can be easily applied to electronic parts such as a semiconductor substrate, a printed circuit board, and an EMC (Epoxy molding Compound).

The invention claimed is:

1. A thermosetting resin composition comprising:
   (i) a benzoxazine-based compound having two or more allyl groups at the terminal,
   (ii) an epoxy resin having two or more epoxy rings,
   (iii) an active ester-modified curing agent, and
   (iv) a nitrogen-based curing agent,
   wherein the (i) benzoxazine-based compound having two or more allyl groups at the terminal comprises at least one selected from the compounds of the following formulas 1 to 4:

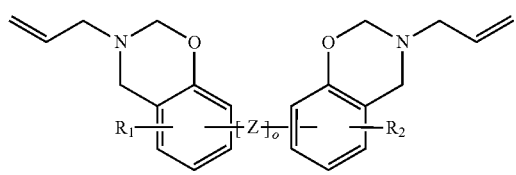

Formula 1

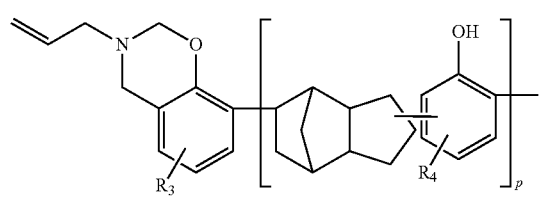

Formula 2

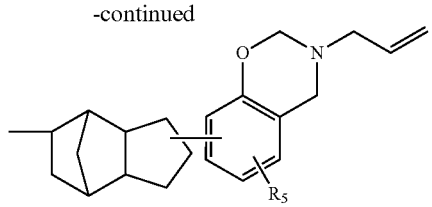

Formula 3

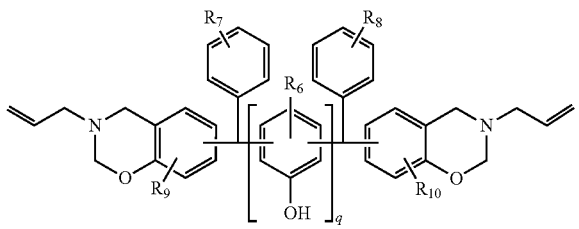

Formula 4

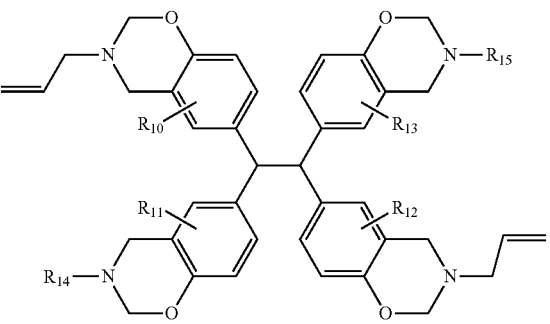

wherein
Z is —R'—(S)n-R"—, wherein R' and R" are the same or different from each other and each independently are a C1 to C5 alkylene group, and n is an integer of 1 to 4;
$R_1$ to $R_{13}$ are the same or different from each other and each independently are H, a halogen, a carboxyl group, a C1 to C20 alkyl group, a C3 to C20 cycloalkyl group, a C2 to C20 alkenyl group, a C2 to C20 alkynyl group, a C2 to C20 alkoxy group, a C6 to C20 aryl group, a C7 to C20 aralkyl group, or an allyl group, wherein the aryl group or the aralkyl group includes a fused ring;
$R_{14}$ and $R_{15}$ are the same or different from each other and each independently are a C6-C20 aryl group, a C7-C20 aralkyl group, or an allyl group;
o is an integer of 1 to 5; and
p and q are each independently an integer of 0 to 5.

2. The thermosetting resin composition according to claim 1, wherein the thermosetting resin composition comprises from 1 to 50% by weight of the benzoxazine-based compound, from 30 to 80% by weight of the epoxy resin, from 5 to 30% by weight of the active ester-modified curing agent, and from 0.0001 to 5% by weight of the nitrogen-based curing agent, each based on the total weight of the composition.

3. A prepreg formed by impregnating a fiber substrate with the thermosetting resin composition according to claim 2.

4. The prepreg according to claim 3, wherein the fiber substrate comprises at least one selected from the group consisting of glass fiber, glass paper, glass fiber nonwoven fabric, glass fabric, aramid fiber, aramid paper, polyester fiber, carbon fiber, inorganic fiber and organic fiber.

5. A printed circuit board formed by laminating the prepreg of claim 3 in one or more layers.

6. The thermosetting resin composition according to claim 1, wherein the (ii) epoxy resin comprises a dicyclopentadiene-based epoxy resin having an epoxy equivalent of from 200 to 500 g/eq.

7. A prepreg formed by impregnating a fiber substrate with the thermosetting resin composition according to claim 6.

8. The prepreg according to claim 7, wherein the fiber substrate comprises at least one selected from the group consisting of glass fiber, glass paper, glass fiber nonwoven fabric, glass fabric, aramid fiber, aramid paper, polyester fiber, carbon fiber, inorganic fiber and organic fiber.

9. A printed circuit board formed by laminating the prepreg of claim 7 in one or more layers.

10. The thermosetting resin composition according to claim 1, wherein the (iii) active ester-modified curing agent comprises at least one curing agent selected from the group consisting of a phenol ester-based curing agent, a thiophenol ester-based curing agent, an N-hydroxylamine ester-based curing agent, and a heterocyclic hydroxy compound ester-based curing agent.

11. A prepreg formed by impregnating a fiber substrate with the thermosetting resin composition according to claim 10.

12. The prepreg according to claim 11, wherein the fiber substrate comprises at least one selected from the group consisting of glass fiber, glass paper, glass fiber nonwoven fabric, glass fabric, aramid fiber, aramid paper, polyester fiber, carbon fiber, inorganic fiber and organic fiber.

13. A printed circuit board formed by laminating the prepreg of claim 11 in one or more layers.

14. The thermosetting resin composition according to claim 1, wherein the (iv) nitrogen-based curing agent comprises at least one curing agent selected from the group consisting of an amine-based curing agent, a triazine-phenol-based curing agent, a carbodiimide-based curing agent, and a cyanate ester-based curing agent.

15. A prepreg formed by impregnating a fiber substrate with the thermosetting resin composition according to claim 14.

16. The prepreg according to claim 15, wherein the fiber substrate comprises at least one selected from the group consisting of glass fiber, glass paper, glass fiber nonwoven fabric, glass fabric, aramid fiber, aramid paper, polyester fiber, carbon fiber, inorganic fiber and organic fiber.

17. A printed circuit board formed by laminating the prepreg of claim 15 in one or more layers.

18. A prepreg formed by impregnating a fiber substrate with the thermosetting resin composition according to claim 1.

19. The prepreg according to claim 18, wherein the fiber substrate comprises at least one selected from the group consisting of glass fiber, glass paper, glass fiber nonwoven fabric, glass fabric, aramid fiber, aramid paper, polyester fiber, carbon fiber, inorganic fiber and organic fiber.

20. A printed circuit board formed by laminating the prepreg of claim 18 in one or more layers.

* * * * *